(12) United States Patent
Tanaka

(10) Patent No.: US 6,898,340 B2
(45) Date of Patent: May 24, 2005

(54) SEMICONDUCTOR LIGHT EMITTING ELEMENT AND METHOD OF MAKING THE SAME

(75) Inventor: Haruo Tanaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 199 days.

(21) Appl. No.: 10/375,941

(22) Filed: Feb. 25, 2003

(65) Prior Publication Data

US 2003/0232455 A1 Dec. 18, 2003

(30) Foreign Application Priority Data

Feb. 28, 2002 (JP) ........................................ 2002-053704

(51) Int. Cl.⁷ ............................. G02B 6/12; H01L 29/06
(52) U.S. Cl. ................. 385/14; 385/129; 385/130; 385/131; 257/12; 257/13; 257/22; 257/97; 257/103
(58) Field of Search ..................... 385/14, 129, 130, 385/131, 132; 257/12, 13, 22, 97, 103

(56) References Cited

U.S. PATENT DOCUMENTS

| 5,900,650 A | * | 5/1999 | Nitta | .......................... 257/94 |
| 6,426,512 B1 | * | 7/2002 | Ito et al. | ......................... 257/12 |
| 6,825,499 B2 | * | 11/2004 | Nakajima et al. | .............. 257/95 |
| 2003/0042505 A1 | * | 3/2003 | Ito et al. | ...................... 257/200 |
| 2003/0183835 A1 | * | 10/2003 | Moku et al. | ................... 257/99 |

FOREIGN PATENT DOCUMENTS

| JP | 5-13816 | 1/1993 | ............... 385/14 X |
| JP | 2000-31534 | 1/2000 | ............... 385/14 X |

\* cited by examiner

*Primary Examiner*—Brian M. Healy
(74) *Attorney, Agent, or Firm*—Hamre, Schumann, Mueller & Larson, P.C.

(57) ABSTRACT

A semiconductor light-emitting element 10 includes a silicon single crystal substrate 20 having a first and a second surfaces 20a, 20b in head-tail relationship with each other, a GaN-based semiconductor laminate 40 formed on a selected region of the first surface with a predetermined conductive intermediate layer 25 interposed therebetween, a first electrode layer 51 having a portion in contact with an uppermost layer of the GaN-based semiconductor laminate 40 and insulated from the monocrystal silicon substrate, and a second electrode layer 52 formed on a suitable portion of the monocrystal silicon substrate. The monocrystal silicon substrate 20 is formed with a light guide 30 for directing light emitted from the GaN-based semiconductor laminate 40 toward the second surface 20b.

29 Claims, 7 Drawing Sheets

SEMICONDUCTOR LIGHT EMITTING ELEMENT AND METHOD OF MAKING THE SAME

BACKGROUND OF THE INVENTION

1. Field of the Invention

The present invention relates to a semiconductor GaN-based light emitting element containing gallium nitride and to a method of making the same.

2. Description of the Related Art

A semiconductor light-emitting element (a blue-color light-emitting diode) for blue-color light emission has been developed and put to practical use. It has a sapphire substrate on which a compound semiconductor crystal containing gallium nitride (GaN) is epitaxially grown by vapor-phase growth of an organic metal compound. Since sapphire differs only slightly in lattice constant from a GaN-based semiconductor crystal, it provides a suitable surface for epitaxially growing a GaN-based compound semiconductor layer while succeeding the crystal orientation of the sapphire.

However, since sapphire is expensive and has poor processability, a conventional diode for blue-color light emission fabricated with use of such a substrate is inevitably expensive.

On the other hand, JP-A-2000-31534 for example discloses a technique utilizing a silicon single crystal substrate as an inexpensive and readily processible substrate for making a blue-color light-emitting diode. According to this technique, a monocrystal silicon substrate is surface-treated with hydrogen and then formed with a titanium nitride layer as an intermediate layer for growth of a GaN-based semiconductor. Such hydrogen surface treatment makes hydrogen joined to dangling bonds on the surface of the silicon substrate, which prevents formation of titanium silicide which is an amorphous layer. Further, since titanium nitride has a cubic crystal structure similarly to silicon, titanium nitride can be appropriately grown on the silicon substrate while succeeding the crystal orientation of silicon. Further, by properly setting the thickness of the TiN layer, the GaN-based compound semiconductor layers subsequently formed thereon also succeed the crystal orientation of silicon.

In place of forming an intermediate layer of TiN as described above, the above document also proposes another method which utilizes an intermediate layer made of AlN/AlCaN for forming a blue-light-emitting diode by epitaxial growth of a GaN-based semiconductor on a monocrystal silicon substrate.

However, since silicon is a light-absorptive material as is generally known, the blue-color light-emitting diode disclosed in the above document still has room for improvement in light-emitting efficiency.

To improve light-emitting efficiency, JP-A-5-13816 for example proposes a technique which takes advantage of transparency of a sapphire substrate for emitting light from the sapphire substrate.

However, since sapphire is expensive and has a poor processability as described above, a blue-color light-emitting diode fabricated with use of a sapphire substrate is still expensive. Further, it is desirable to make the chip as small as possible in view of the high cost of the substrate while also increasing the current density passing through the activation layer. Then, some practical and useful way must be sought for properly mounting such a compact chip on a mother substrate or frame while maintaining the light-emitting efficiency.

SUMMARY OF THE INVENTION

The present invention has been proposed under the circumstances described above. It is, therefore, an object of the present invention to provide a semiconductor light-emitting element which is less costly but yet provides enhanced light-emitting efficiency.

It is another object of the present invention to provide a semiconductor light-emitting element which can be easily mounted on a carrier while providing good light-emitting efficiency.

To fulfill the above-mentioned objects, the present invention employs the following technical measures.

A semiconductor light-emitting element according to a first aspect of the present invention comprises a silicon single crystal substrate having a first and a second surfaces in head-tail relationship with each other, a GaN-based semiconductor laminate formed on a selected region of the first surface with a predetermined conductive intermediate layer interposed therebetween, a first electrode layer having a portion in contact with an uppermost layer of the GaN-based semiconductor laminate and insulated from the monocrystal silicon substrate, and a second electrode layer formed on a suitable portion of the monocrystal silicon substrate. The monocrystal silicon substrate is formed with a light guide for directing light emitted from the GaN-based semiconductor laminate toward the second surface.

According to a preferred embodiment, the light guide comprises a hole penetrating the monocrystal silicon substrate thicknesswise, and the GaN-based semiconductor laminate includes a lowermost layer whose surface includes a portion substantially exposed to the second surface.

In this case, the hole may be preferably filled with translucent resin. Further, the resin may preferably contain a fluorescent or light scattering material.

In the preferred embodiment, the hole flares to have increasing diameter toward the second surface. Alternatively, the hole may be parabolic to have increasing diameter toward the second surface.

In the preferred embodiment, the uppermost layer of the GaN-based semiconductor laminate is covered with a insulating layer excepting a predetermined center region contacting the first electrode layer.

In the preferred embodiment, the center region has a diameter smaller than that of the hole formed with the monocrystal silicon substrate.

In the preferred embodiment, the selected region is provided in a depression of the first surface. The depression may be preferably filled with a protective member. Further, the protective member may be preferably heat-conductive.

According to another preferred embodiment, the GaN-based semiconductor laminate has a portion positioned offset thicknesswise relative to the other portion.

According to a further preferred embodiment, the first surface of the monocrystal silicon substrate is formed with another electronic element.

Preferably, the first and the second electrode layers may be arranged on the first surface side of the monocrystal silicon substrate.

A second aspect of the present invention provides a mounting structure of a semiconductor light-emitting element which is characterized that the semiconductor light-emitting element according to the first aspect is mounted on a carrier with the first surface directed downward.

A third aspect of the present invention provides a method of manufacturing a semiconductor light-emitting element, which is characterized by the following steps.

(a) A step of forming a GaN-based semiconductor laminate on a selected region of a first surface of a monocrystal silicon substrate with a predetermined conductive intermediate layer interposed therebetween. The monocrystal silicon substrate also having a second surface in head-tail relationship with the first surface.

(b) A step of forming a first electrode layer and a second electrode layer. The first electrode layer has a portion in contact with an uppermost layer of the GaN-based semiconductor laminate and is insulated from the monocrystal silicon substrate. The second electrode layer is formed on a suitable portion of the monocrystal silicon substrate.

(c) A step of forming a light guide in the monocrystal silicon substrate for directing light emitted from the GaN-based semiconductor laminate toward the second surface.

A fourth aspect of the present invention provides a semiconductor light-emitting element which comprises a monocrystal silicon substrate having a first and a second surfaces in head-tail relationship with each other, and a light-emitting diode chip mounted on a selected region of the first surface. The monocrystal silicon substrate is formed with a light guide for directing light emitted from the light-emitting diode chip toward the second surface.

According to a preferred embodiment, the light-emitting diode chip is a blue-color light-emitting diode chip formed by growing a GaN-based semiconductor laminate on a sapphire substrate.

In this case, the blue-color light-emitting diode chip may be mounted on the selected region with the sapphire substrate directed downward. Alternatively, the blue-color light-emitting diode chip may be mounted on the selected region with the sapphire substrate directed upward.

In the preferred embodiment, the light guide comprises a hole penetrating the monocrystal silicon substrate thicknesswise with a portion of the light-emitting diode chip substantially exposed to the second surface side.

In the preferred embodiment, the hole may be preferably filled with translucent resin. Further, the resin may preferably contain a fluorescent or light scattering material.

In the preferred embodiment, the hole flares to have increasing diameter toward the second surface. Alternatively, the hole may be parabolic to have increasing diameter toward the second surface.

In the preferred embodiment, the selected region is provided in a depression of the first surface. In this case, the depression may be preferably filled with a protective member.

In another preferred embodiment, the first surface of the monocrystal silicon substrate is formed with another electronic element.

Preferably, the first surface of the monocrystal silicon substrate may be provided with a first electrode layer connected to an electrode of the blue-color light-emitting diode chip, and a second electrode layer connected to another electrode of the blue-color light-emitting diode chip.

A fifth aspect of the present invention provides a mounting structure of a semiconductor light-emitting element, wherein the semiconductor light-emitting element according to the fourth aspect of the present invention is mounted on a carrier with the first surface facing downward.

Other features and advantages of the present invention will become clearer from the detailed description of the preferred embodiments given below with reference to the accompanying drawings.

BRIEF DESCRIPTION OF THE DRAWINGS

FIG. 1A is a vertical sectional view a semiconductor light-emitting element according to showing a first embodiment of the present invention, whereas

DETAILED DESCRIPTION OF THE PREFERRED EMBODIMENT

Figure 1A:
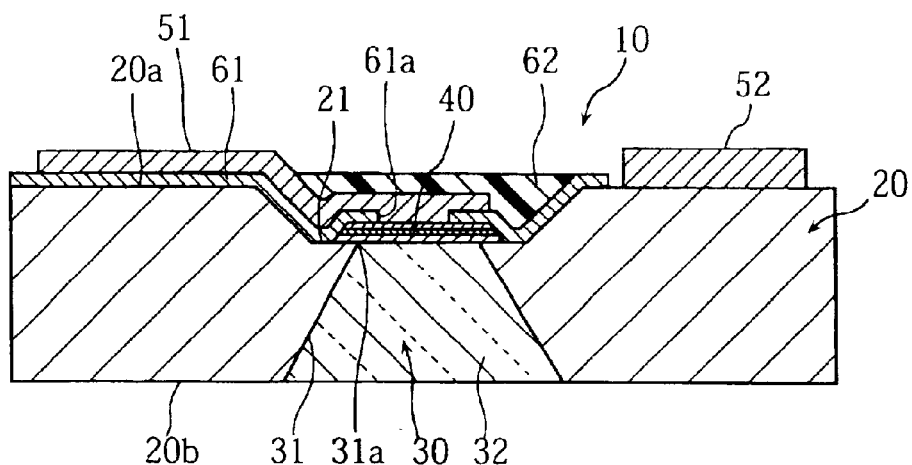
Figure 1B:
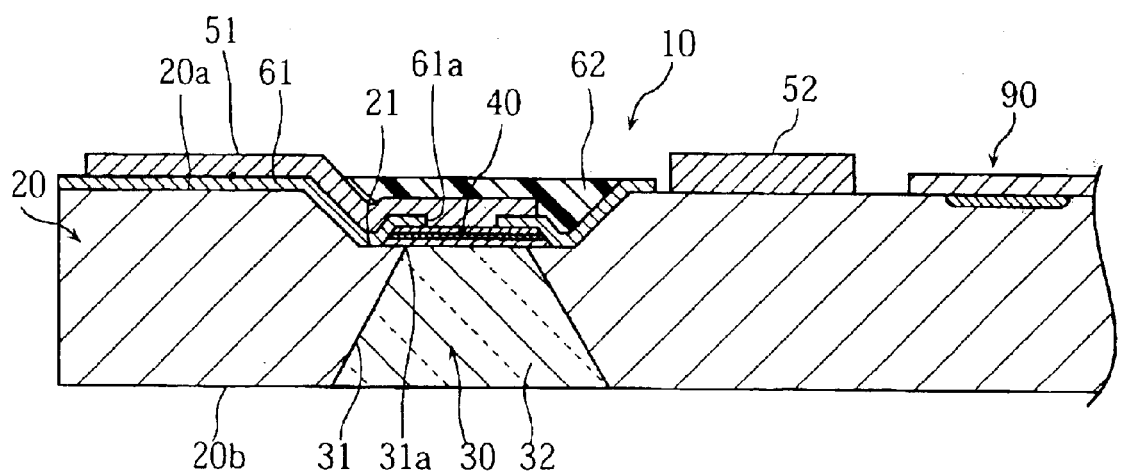
FIG. 1B is a vertical sectional view showing a semiconductor light-emitting element according to a modification of the first embodiment of the present invention.

Preferred embodiments of the present invention will be described below in detail with reference to the accompanying drawings. FIG. 1A is a view of a semiconductor light-emitting element 10, in vertical section, according to a first embodiment of the present invention, FIG. 1B is a view of a modification of the first embodiment, in vertical section, FIG. 2 is an enlarged view showing a principal part of FIG. 1A, and FIGS. 3A–3E show an example of process for making the semiconductor light-emitting element shown in FIG. 1A.

Figure 2:
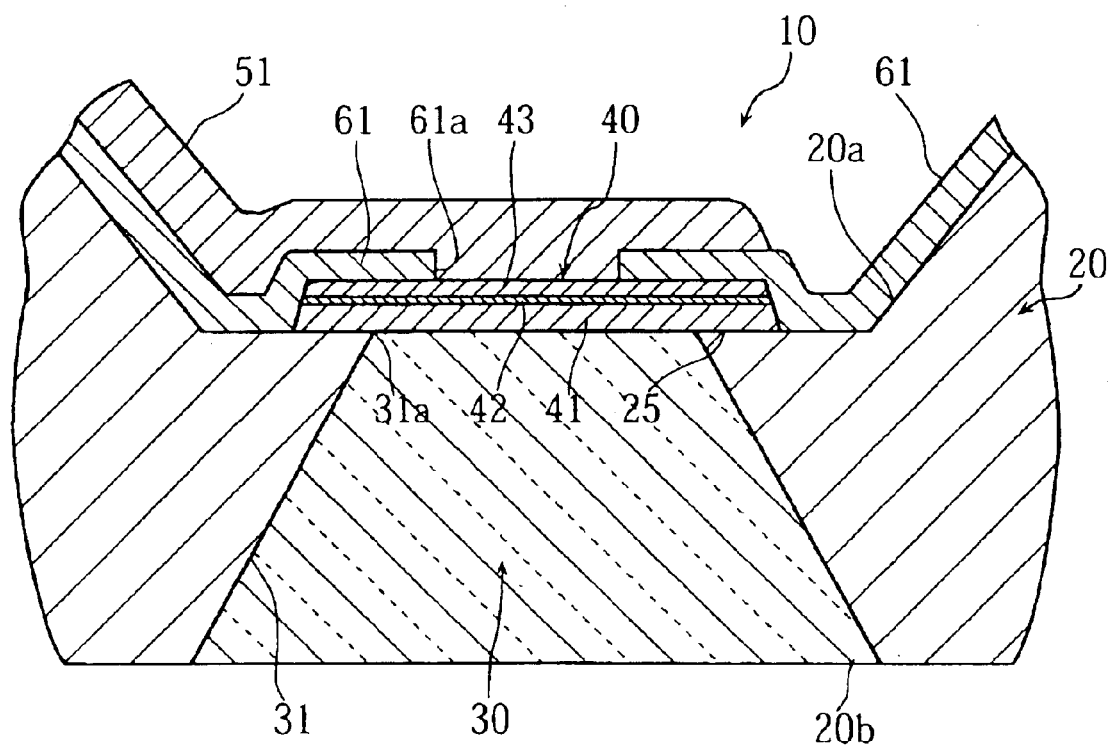
FIG. 2 is an enlarged sectional view of a principal part of the semiconductor light-emitting element shown in FIG. 1A.

As shown in FIGS. 1A and 2, the semiconductor light-emitting element 10 includes a monocrystal silicon substrate 20 of a predetermined thickness having an upper or first surface 20A and a lower or second surface 20B. The monocrystal silicon substrate 20 is rectanglar in plan view for example. The upper surface of the monocrystal silicon substrate 20 has a selected center region formed with a depression 21 of a predetermined depth. The depression 21 is circular in plan view for example.

The monocrystal silicon substrate 20 is formed with a thorough-hole 31 extending thicknesswise from the bottom of the depression 21 to the second surface 20b. The through-hole 31 preferably flares to have increasing diameter toward the second surface 20b.

The depression 21 is provided with a GaN-based semiconductor laminate 40 riding on a peripheral mouth portion 31a of the hole 31. More specifically, as clearly shown in FIG. 2, the GaN-based semiconductor laminate 40 includes for example an N-type semiconductor layer 41 (GaN layer or AlGaN layer), an activation layer 42 (InGaN layer), and a P-type semiconductor layer 43 (GaN layer of AlGaN layer). These layers are successively formed by epitaxial growth. To realize appropriate growth of the GaN-based semiconductor laminate 40 on the monocrystal silicon substrate 20, an intermediate layer 25 of e.g. titanium nitride (TiN) is first formed on the monocrystal silicon substrate 20 before the growth of and then the GaN-based semiconductor laminate 40. A method of forming the GaN-based semiconductor laminate 40 will be described later with reference to FIGS. 3A–3E.

The uppermost layer of the GaN-based semiconductor laminate 40 has a surface held in contact with a part of a first electrode layer 51. The first electrode layer 51 is insulated from the monocrystal silicon substrate 20. More specifically, the first surface 20a of the monocrystal silicon substrate 20 is formed with an insulating layer 61 of e.g. SiO2 by vacuum spattering or vapor deposition optionally combined with etching. The insulating layer covers the uppermost layer of the GaN-based semiconductor laminate 40 other than a predetermined center region while also covering a region from the depression 21 to the first surface 20a where the first electrode layer 51 extends. The first electrode layer 51 is formed by vacuum spattering or vapor deposition of an Au- or Ag-based conductive metal optionally combined with etching. In the illustrated embodiment, first electrode layer 51 has one end contacting the upper surface of the GaN-based semiconductor laminate 40 at the inside of the depression 21, whereas the other end is positioned at a suitable portion over the first surface 20a of the monocrystal silicon substrate 20. The insulating layer 61 has a mouth 61a, which is diamatically smaller than the mouth 31a of the hole 31 on the first surface 20a of the monocrystal silicon substrate 20 for exposing the upper surface of the semiconductor laminate 40. The first surface 20a of the monocrystal silicon substrate 20 also has a suitably selected portion formed with a second electrode layer 52 electrically connected to the monocrystal silicon substrate 20. The second electrode layer 52 may be formed in the same manner as the first electrode layer 51.

The depression 21 is filled with a protective member 62 of e.g. epoxy resin for partially burying the first electrode layer 51. The protective member 62 preferably contains a good heat-conductive material such as a silicon for adjusting heat dissipation.

The hole 31 is preferably filled with a translucent resin 32 such as epoxy resin. The epoxy resin serves as a light guide 30 for guiding light emitted from the GaN-based semiconductor laminate 40 toward from the second surface 20b side while also serving as a protective member for the semiconductor laminate 40. The epoxy resin may be contain a light scattering material such as fluorescent or metalic particles.

With the structure described above, the P-type semiconductor layer 43 of the GaN-based semiconductor laminate 40 is connected to the first electrode layer 51, whereas the N-type semiconductor layer 41 is connected to the second electrode layer 52 via the monocrystal silicon substrate 20. Consequently, voltage application across the electrode layers 51 and 52 causes the activator 42 of the GaN-based semiconductor laminate 40 to emit blue-light. The light can be efficiently let out beyond the second surface 20b of the monocrystal silicon substrate 20 via the light guide 30. As described above, when the light guide 30 (epoxy resin 32) contains a fluorescent or light scattering material, light can be adjusted emitted efficiently from the entire mouth of the light guide 30 beyond the second surface 20 while also providing a possibility for color adjustment. Further, in the illustrated embodiment, the exposed portion of the GaN-based semiconductor laminate 40 at the first surface 20a side is completely covered with a metal electrode layer (the first electrode layer 51). Consequently, the metal electrode layer serves as a reflector for efficiently reflecting light, traveling from the activation layer 42 upward in FIG. 1A, toward the light guide 30, which also results in significant improvement in light-emitting efficiency. Further, the mouth 61a of the insulating layer 61 covering the GaN-based semiconductor laminate 40 at the first surface 20a has is diametrically smaller than the light guide 30. Consequently, the activation layer 42 can emit light primarily from the selected center region. Thus, the light-emitting portion can be prevented from being shaded behind the edge 31a of the hole 31 of the monocrystal silicon substrate 20, which also contributes to improvement of light-emitting efficiency.

In addition, the substrate of the semiconductor light-emitting element 10 is made of monocrystal silicon. Consequently, as shown in FIG. 1B, wafer process maybe performed on the first surface 20a of the substrate 20 to form another element or a set of elements 90 such as a current regulating drive circuit or a logic circuit as a part of an IC-built-in semiconductor light-emitting element, or to form a discrete element such as a diode, or sensor or the like.

Figure 4:
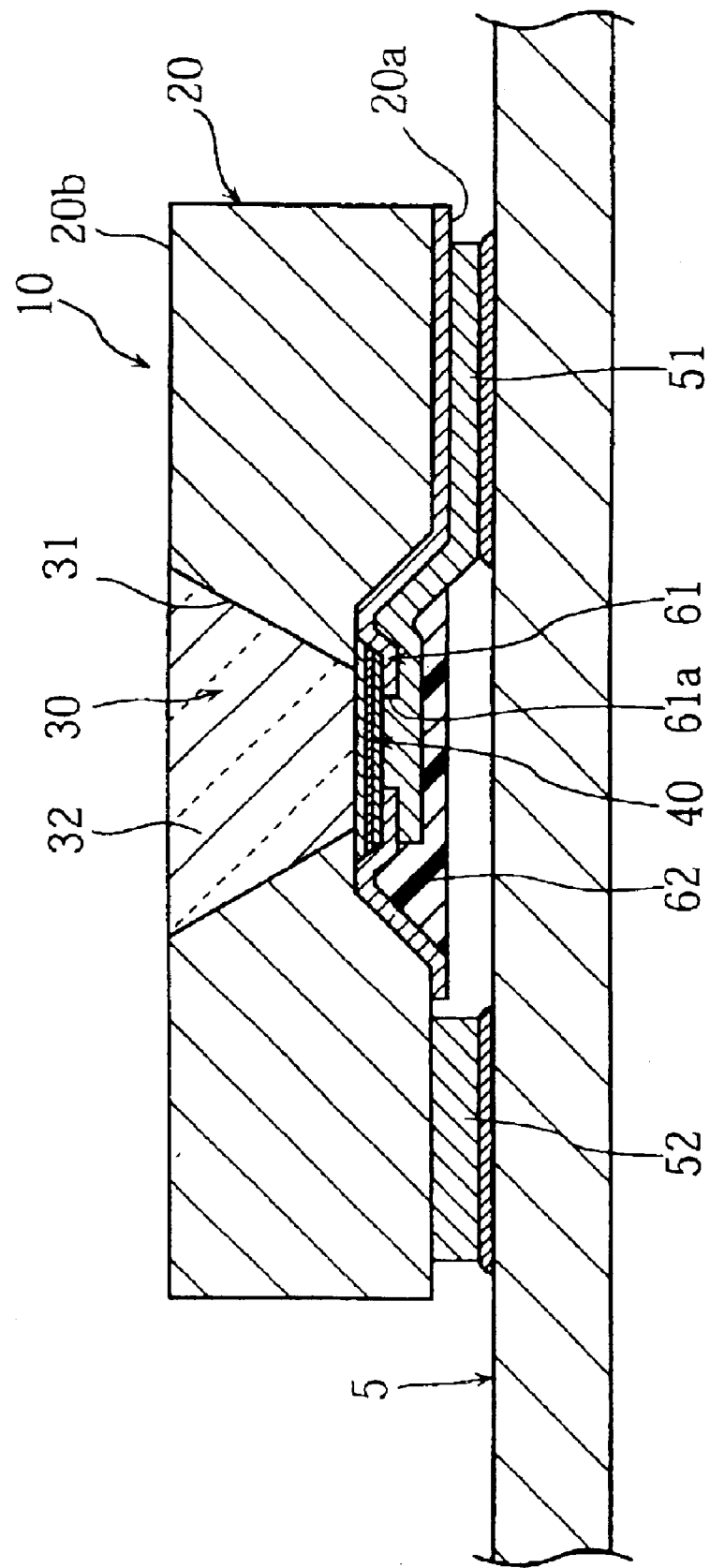
FIG. 4 shows the semiconductor light-emitting element of FIG. 1A in a mounted condition.

FIG. 4 shows an example of mounting structure wherein the semiconductor light-emitting element 10 having the above-described arrangement is mounted on a carrier such as a mother board 5. Since the first electrode layer 51 and the second electrode layer 52 are formed on the first surface 20a of the monocrystal silicon substrate 20, the semiconductor light-emitting element 10 can be mounted in face-down relation onto the mother substrate 5. In such a mounting structure, light emitted from the GaN-based semiconductor laminate 40 advantageously goes out upward via the light guide 30.

Next, reference is made to FIGS. 3A–3E for describing an example of process of making the semiconductor light-emitting element 10 having the above-described structure.

Figure 3A:
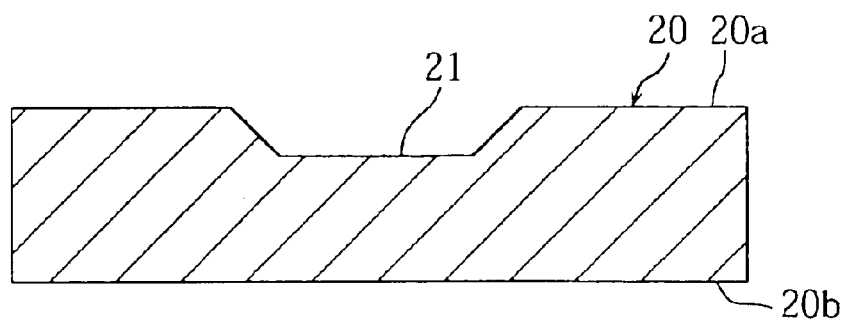
FIGS. 3A–3E show an example of method of making the semiconductor light-emitting element shown in FIG. 1A.
Figure 3B:
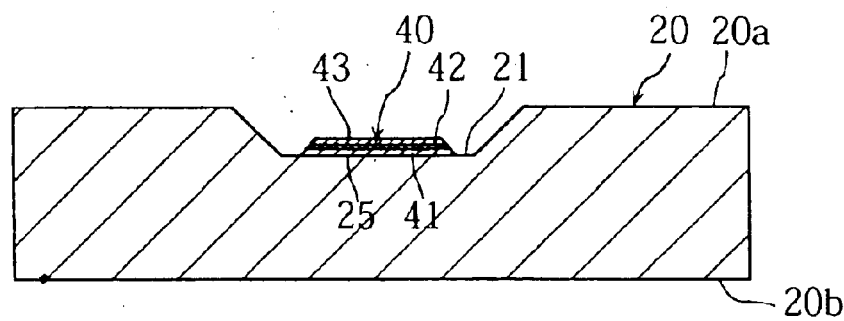

As shown in FIG. 3A, a monocrystal silicon substrate 20 is prepared. The monocrystal silicon substrate 20 has a thickness of 200–400 μm and includes a first and a second surfaces 20a, 20b in head-tail relationship. The figure shows a devided region only for an individual semiconductor light-emitting element which is rectangular in top view. In actual production, use may be made of a wafer which corresponds to a plurality of such regions arranged vertically and horizontally. The first surface 20a has a depression 21 formed by etching for example. The depression 21 is circular for example in top view.

The depression 21 on the first surface 20a of the Monocrystal silicon substrate 20 is formed with a GaN-based semiconductor laminate 40. To form properly such a semiconductor laminate 40, the monocrystal silicon substrate 20 is hydrogen-terminated follower by forming an intermediate layer 25 of titanium nitride (TiN) by plasma spattering for example. Subsequently, the GaN-based semiconductor laminate 40 is formed on the intermediate layer by epitaxial growth. More specifically, the GaN-based semiconductor laminate 40 is formed by successive epitaxial growth of an N-type semiconductor layer 41 (GaN layer or AlGaN layer), an activation layer 42 (InGaN layer), and a P-type semiconductor layer 43 (GaN layer or AlGaN layer). To limit the area of the GaN-based semiconductor laminate 40 to the region of the depression 21, the semiconductor laminate 40 may be firstly grown on the whole area of the first surface 20a of the monocrystal silicon substrate 20, followed by etching away an excessive portion. Alternatively, the semiconductor laminate 40 may be formed by selective epitaxial growth for limitting the growth region. When the monocrystal silicon substrate is Hydrogen-terminated and then formed with a TiN intermediate layer, a GaN-based semiconductor laminate can be properly grown thereon, as previously mentioned at the beginning of this specification.

Figure 3C:
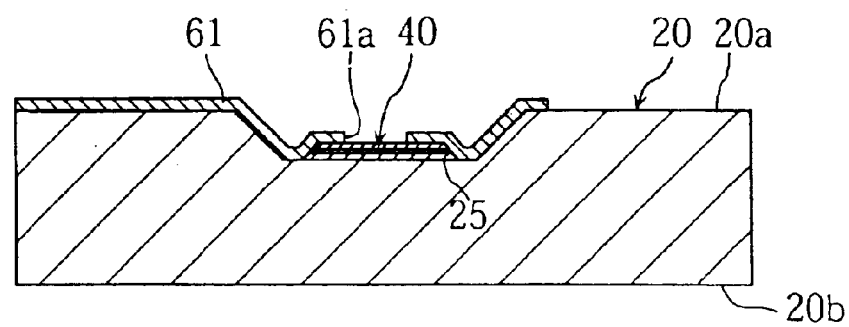

Next, as shown in FIG. 3C, a predetermined portion of the first surface 20a of the monocrystal silicon substrate 20 is formed with an insulating layer 61 of a silicon oxide layer (SiO2) for example as by vapor deposition, spattering or the like. The insulating layer 61 covers the depression 21 except for the central portion of the upper surface of the GaN-based semiconductor laminate 40 and extends to a suitable portion of the first surface 20a. The coverage area of the insulating layer 61 may be selected by etching.

Figure 3D:
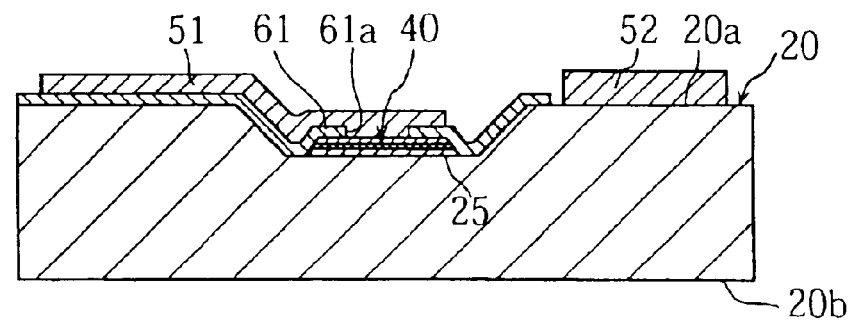

Next, as shown in FIG. 3D, a first and a second electrode layers 51 and 52 are formed. As described above, the first electrode layer 51 is formed in contact with the exposed portion of the upper surface of the GaN-based semiconductor laminate 40 and extends to a suitable position on the first surface 20a. The second electrode layer 52 is directly formed on an appropriate portion of the first surface 20a of the monocrystal silicon substrate 20. The first and second electrode layers 51, 52 are formed by vapor deposition or spattering, and their coverage areas are selected by etching. The electrode layers 51, 52 are made of an Au- or Ag-based metal material for example.

Figure 3E:
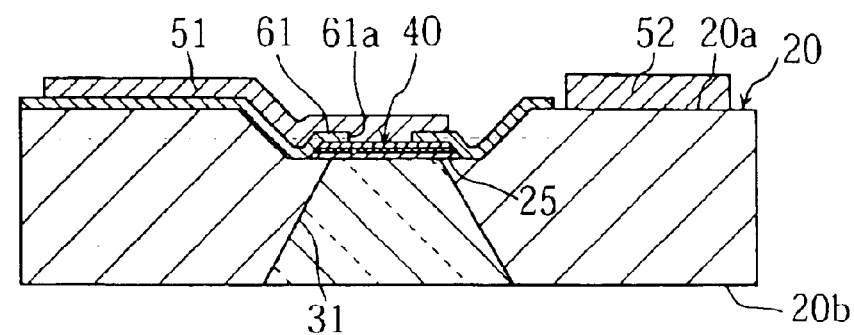

Next, as shown in FIG. 3E, the monocrystal silicon substrate 20 is formed with a hole 31 extending from the second surface 20b to partially expose the bottom surface of the GaN-based semiconductor laminate 40. The hole 31 may be formed by etching for example.

Next, the depression 21 of the first surface 20a is filled with a protective member 62, and the hole 31 is filled with translucent resin 32 such as epoxy resin. Then, the wafer is divided into unit elements for providing the semiconductor light-emitting elements 10 each having the structure shown in FIG. 1A.

Figure 5:
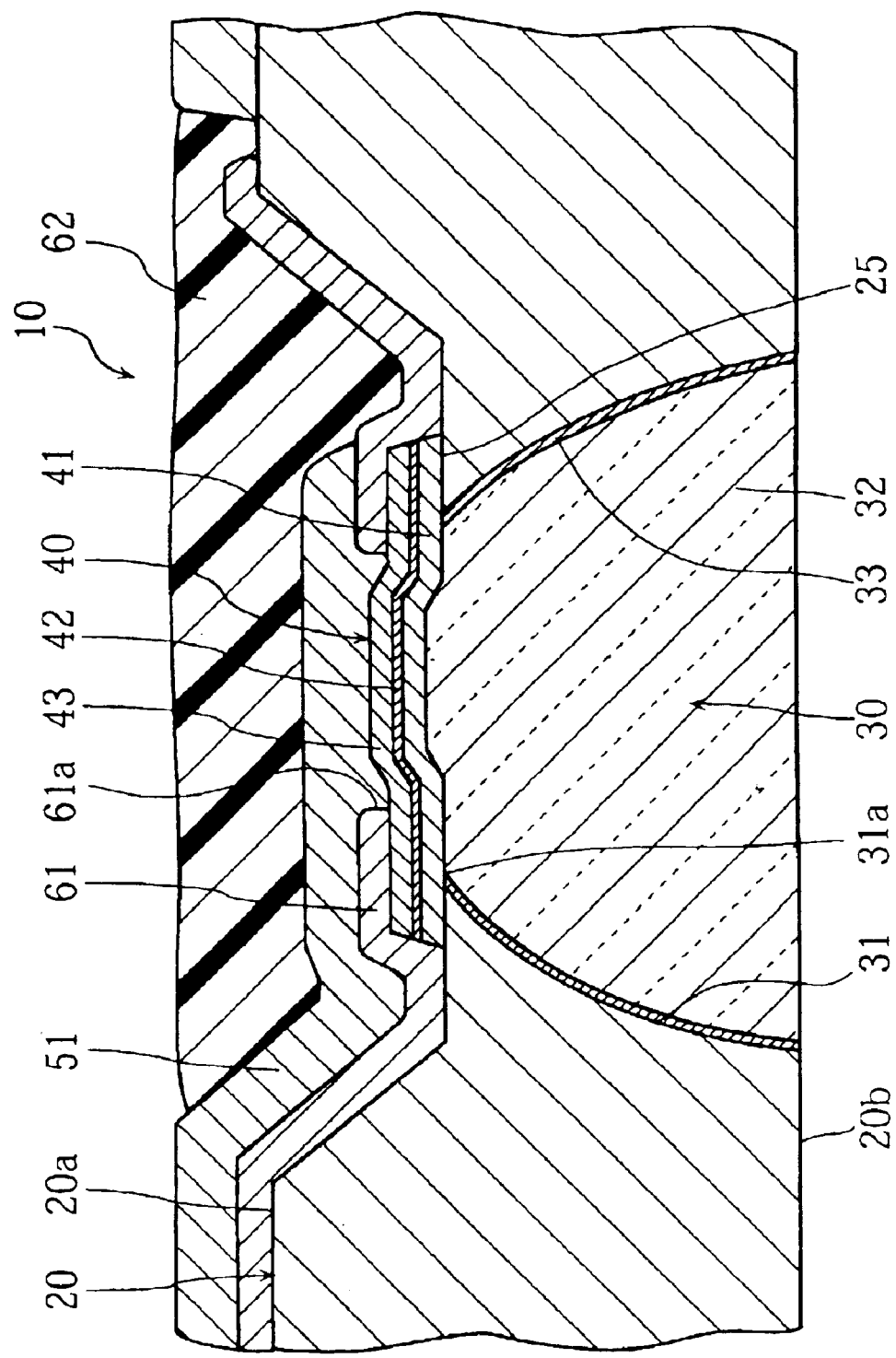
FIG. 5 is a sectional view showing a principal part of a semiconductor light-emitting element according to a second embodiment of the present invention.

FIG. 5 is a sectional view showing a principal part of a semiconductor light-emitting element 10 according to a second embodiment of the present invention. This embodiment differs from the embodiment shown in FIG. 1A in the following respects. A GaN-based semiconductor laminate 40 includes a central region positioned offset toward a first surface 20a of a monocrystal silicon substrate 20 relative to a peripheral region. A hole 31 formed in the monocrystal silicon substrate 20 is parabolic with its diameter increasing toward the second surface 20b. Further, the hole 31 has an inner surface provided with a reflector 33 formed by vapor deposition of Ag or Al for example. The structure is otherwise the same as in the embodiment shown in FIG. 1A, and is not further described.

Since the GaN-based semiconductor laminate 40 is partially offset as described above, the surface of the semiconductor laminate 40 is bent. Since the GaN-based semiconductor laminate 40 has a reflective index of no less than 2, light emitted from the activation layer 42 encounters difficulty in going out. However, the bent surface of the semiconductor layer 40 increases the possibility that the light traveling within the semiconductor laminate 40 strikes into the surface at an angle smaller than the critical reflection angle, which assists the light to go out. This contributes to improvement in the light-emitting efficiency of the semiconductor light-emitting element 10.

Further, since the inner surface of hole 31 is parabolic inner surface as described above with the reflector 33 formed thereon, light can be efficiently emitted outside. It is easily understood that the semiconductor light-emitting element 10 according to this embodiment can be fabricated in the same manner as described above with reference to FIGS. 3A–3E.

Figure 6:
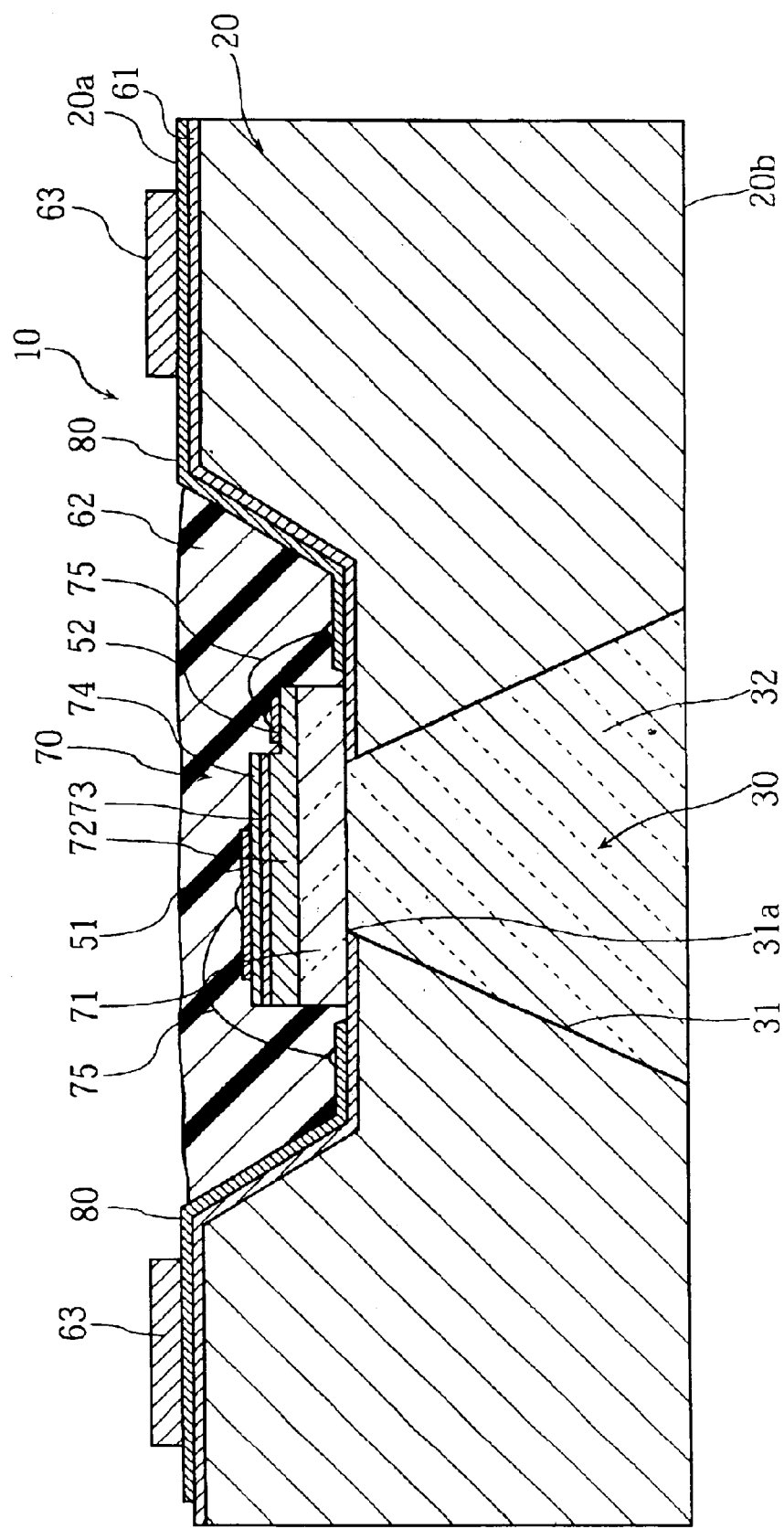
FIG. 6 is a sectional view showing a principal part of a semiconductor light-emitting element according to a third embodiment of the present invention.

FIG. 6 is a sectional view showing a semiconductor light-emitting element 10 according to a third embodiment of the present invention. The semiconductor light-emitting element 10 has a monocrystal silicon substrate 20 including a first and a second surfaces 20a, 20b. The first surface 20a is provided with a blue-color light-emitting diode chip 70 fabricated in a conventional manner. Light emitted from the blue-color light-emitting diode chip 70 goes out from the second surface 20b of the substrate 20 via a light guide 30 penetrating the monocrystal silicon substrate 20.

The blue-color light-emitting diode chip 70 fabricated in the conventional manner has a sapphire substrate 71 including an upper surface successively formed with an N-type semiconductor layer 72 (GaN layer or AlGaN layer), an activation layer 73 (InGaN layer), and a P-type semiconductor layer 74 (GaN layer or AlGaN layer). The N-type semiconductor layer 72 has an exposed portion formed with an N-side electrode 52, whereas the P-type semiconductor layer 74 includes a surface formed with a P-side electrode 51. In this embodiment, the chip is mounted on a depression 21 formed on the first surface 20a with the sapphire substrate 71 positioned below. Each of the N-side electrode 52 and the P-side electrode 51 is connected, by wire bonding, to a corresponding wiring pattern 80 arranged on the first surface 20a. Wiring patterns 80 corresponding to the N-side electrode 52 and the P-side electrode 54 extend to suitable portions on the first surface 20a where bumps 63 are formed. Each wiring pattern 80 has a lower surface formed with an insulating layer 61 made of e.g. silicon oxide film for insulation from the monocrystal silicon substrate 20.

As in the first embodiment, the hole 31 formed in the monocrystal silicon substrate 20 is preferably filled with translucent resin 32 such as epoxy resin. The depression 21 on the first surface 20a is also filled with a protective member 62 such as epoxy resin to protect the chip 70 and the bonding wires 75.

In the structure described above, light emitted from the activation layer 73 of the light-emitting diode chip 70 travels via the transparent sapphire substrate 71 and the light guide 30 to go out efficiently from the second surface 20b. The P-side electrode 51 which is a full-surface electrode functions as a reflector. Thus, light emitted from the activation layer 73 upward in FIG. 6 is reflected toward the light guide 30 to go out from the second surface 20b of the substrate 20 efficiently without being wasted.

In this embodiment, similarly to the first embodiment, the monocrystal silicon substrate 20 may be formed integrally with a current regulating drive circuit or a logic circuit by wafer process. The semiconductor light-emitting element may be mounted on a carrier such as a mother substrate 5 with the first surface 20a of the substrate 20 directed down.

Figure 7:
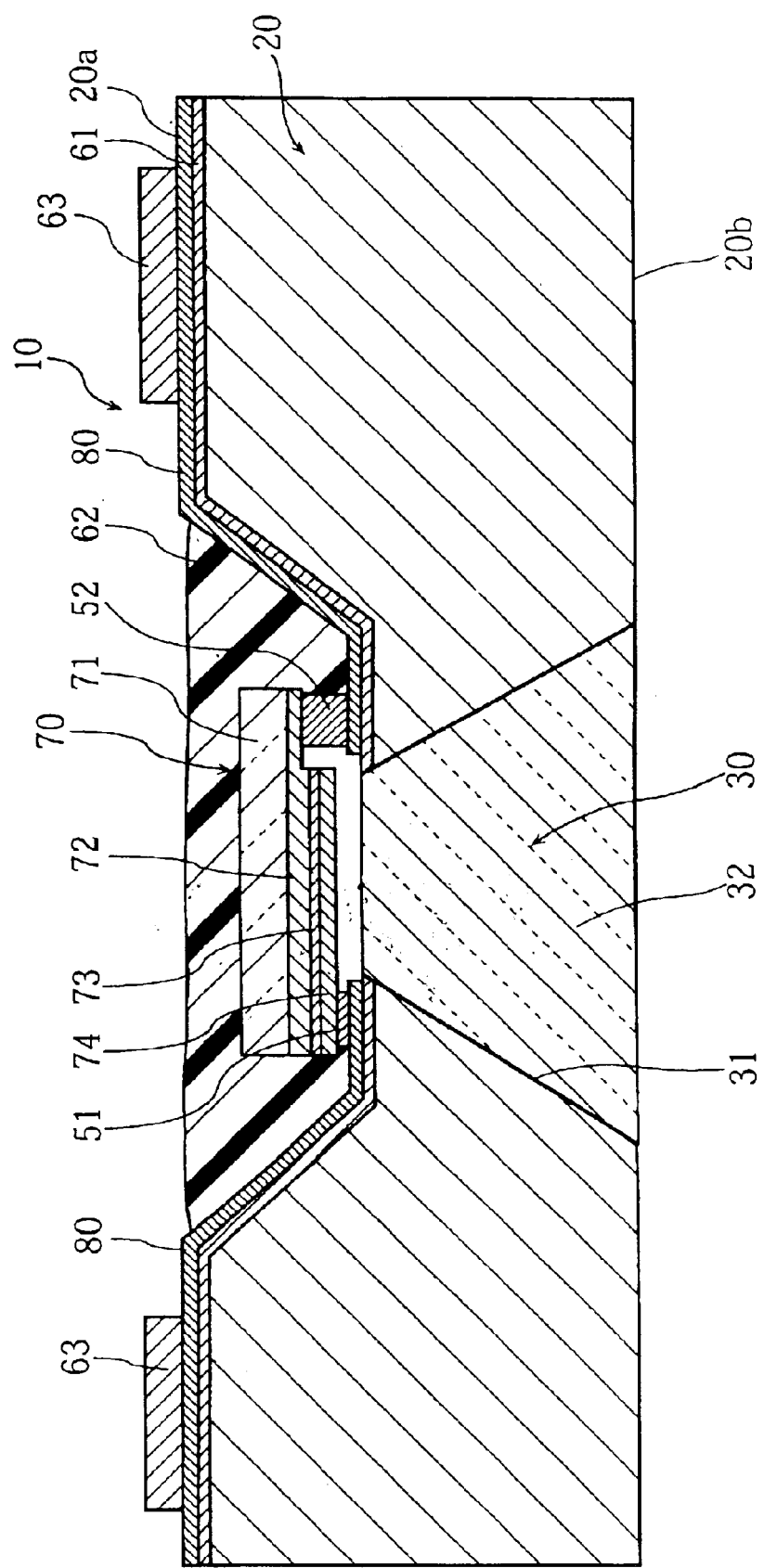
FIG. 7 is a sectional view showing a principal part of a semiconductor light-emitting element according to a fourth embodiment of the present invention.

FIG. 7 is a sectional view showing a semiconductor light-emitting element 10 according to a fourth embodiment of the present invention. This embodiment, as in the embodiment shown in FIG. 6, utilizes a blue-color light-emitting diode chip 70 fabricated in a conventional manner. However, the chip is mounted on a sapphire substrate 71 positioned above. In this case, an N-side electrode 52 and a P-side electrode 51 are adjusted in height, and each of the electrodes 51, 52 is connected directly to a respective wiring pattern 80 via an anisotropic conductive layer or a conductive adhesive. The structure is otherwise the same as in the embodiment shown in FIG. 6, and is not further described. It may be easily understood that this embodiment enjoys the same benefits as the embodiment shown in FIG. 6. In addition, in this embodiment, when the surface of the sapphire substrate 71 is formed with a metal reflector (not shown), light traveling from the activation layer 73 upward in the figure is reflected toward the light guide 30, which enhances light-emitting efficiency of the semiconductor light-emitting element 10.

The present invention is not limited to the specific embodiments described above. All variations covered by the following claims are intended to be included in the scope of the present invention.

For instance, the intermediate layer 25 for proper growth of the GaN-based semiconductor laminate 40 on the monocrystal silicon substrate 20 may be made of AlN/AlGaN instead of TiN.

What is claimed is:

1. A semiconductor light-emitting element comprising: a silicon single crystal substrate having a first and a second surfaces in head-tail relationship with each other; a GaN-based semiconductor laminate formed on a selected region of the first surface with a predetermined conductive intermediate layer interposed therebetween; a first electrode layer having a portion in contact with an uppermost layer of the GaN-based semiconductor laminate and insulated from the monocrystal silicon substrate; and a second electrode layer formed on a suitable portion of the monocrystal silicon substrate; wherein the monocrystal silicon substrate is formed with a light guide for directing light emitted from the GaN-based semiconductor laminate toward the second surface.

2. The semiconductor light-emitting element according to claim 1, wherein the light guide comprises a hole penetrating the monocrystal silicon substrate thicknesswise, the GaN-based semiconductor laminate including a lowermost layer whose surface includes a portion substantially exposed to the second surface.

3. The semiconductor light-emitting element according to claim 2, wherein the hole is filled with translucent resin.

4. The semiconductor light-emitting element according to claim 3, wherein the resin contains a fluorescent or light scattering material.

5. The semiconductor light-emitting element according to claim 2, wherein the hole flares to have increasing diameter toward the second surface.

6. The semiconductor light-emitting element according to claim 2, wherein the hole is parabolic to have increasing diameter toward the second surface.

7. The semiconductor light-emitting element according to claim 1, wherein the uppermost layer of the GaN-based semiconductor laminate is covered with a insulating layer excepting a predetermined center region contacting the first electrode layer.

8. The semiconductor light-emitting element according to claim 7, wherein the center region has a diameter smaller than that of the hole formed with the monocrystal silicon substrate.

9. The semiconductor light-emitting element according to claim 1, wherein the selected region is provided in a depression of the first surface.

10. The semiconductor light-emitting element according to claim 9, wherein the depression is filled with a protective member.

11. The semiconductor light-emitting element according to claim 10, wherein the protective member is heat-conductive.

12. The semiconductor light-emitting element according to claim 1, wherein the GaN-based semiconductor laminate has a portion positioned offset thicknesswise relative to the other portion.

13. The semiconductor light-emitting element according to claim 1, wherein the first surface of the monocrystal silicon substrate is formed with another electronic element.

14. The semiconductor light-emitting element according to claim 1, wherein the first and the second electrode layers are arranged on the first surface side of the monocrystal silicon substrate.

15. A mounting structure of a semiconductor light-emitting element comprising: a monocrystal silicon substrate having a first and a second surfaces in head-tail relationship with each other; a GaN-based semiconductor laminate formed on a selected region of the first surface with a predetermined conductive intermediate layer interposed therebetween; a first electrode layer having a portion in contact with an uppermost layer of the GaN-based semiconductor laminate and insulated from the monocrystal silicon substrate, the first electrode being arranged on the first surface side of the monocrystal silicon substrate; and a second electrode layer arranged on the first surface side of the monocrystal silicon substrate; wherein the monocrystal silicon substrate is formed with a light guide for directing light emitted from the GaN-based semiconductor laminate toward the second surface, wherein the monocrystal silicon substrate is mounted on a carrier via the first and the second electrode layers.

16. A semiconductor light-emitting element comprising: a monocrystal silicon substrate having a first and a second surfaces in head-tail relationship with each other; and a light-emitting diode chip mounted on a selected region of the first surface; wherein the monocrystal silicon substrate is formed with a light guide for directing light emitted from the light-emitting diode chip toward the second surface.

17. The semiconductor light-emitting element according to claim 16, wherein the light-emitting diode chip is a blue-color light-emitting diode chip formed by growing a GaN-based semiconductor laminate on a sapphire substrate.

18. The semiconductor light-emitting element according to claim 17, wherein the blue-color light-emitting diode chip is mounted on the selected region with the sapphire substrate directed downward.

19. The semiconductor light-emitting element according to claim 18, wherein the blue-color light-emitting diode chip is mounted on the selected region with the sapphire substrate directed upward.

20. The semiconductor light-emitting element according to claim 16, wherein the light guide comprises a hole penetrating the monocrystal silicon substrate thicknesswise with a portion of the light-emitting diode chip substantially exposed to the second surface side.

21. The semiconductor light-emitting element according to claim 20, wherein the hole is filled with translucent resin.

22. The semiconductor light-emitting element according to claim 20, wherein the resin contains a fluorescent or light scattering material.

23. The semiconductor light-emitting element according to claim 16, wherein the hole flares to have increasing diameter toward the second surface.

24. The semiconductor light-emitting element according to claim 16, wherein the hole is parabolic to have increasing diameter toward the second surface.

25. The semiconductor light-emitting element according to claim 16, wherein the selected region is provided in a depression of the first surface.

26. The semiconductor light-emitting element according to claim 25, wherein the depression is filled with a protective member.

27. The semiconductor light-emitting element according to claim 16, wherein the first surface of the monocrystal silicon substrate is formed with another electronic element.

28. The semiconductor light-emitting element according to claim 16, wherein the first surface of the monocrystal silicon substrate is provided with a first electrode layer connected to an electrode of the blue-color light-emitting diode chip, the first surface being also provided with a second electrode layer connected to another electrode of the blue-color light-emitting diode chip.

29. A mounting structure of a semiconductor light-emitting element comprising: a monocrystal silicon substrate having a first and a second surfaces in head-tail relationship with each other; and a light-emitting diode chip mounted on a selected region of the first surface; wherein the monocrystal silicon substrate is formed with a light guide for directing light emitted from the light-emitting diode chip toward the second surface; the first surface of the monocrystal silicon substrate being provided with a first electrode layer connected to an electrode of the blue-color light-emitting diode chip, the first surface being also provided with a second electrode layer connected to another electrode of the blue-color light-emitting diode chip, the light-emitting diode chip being mounted on a carrier via the first and the second electrode layers.

* * * * *